United States Patent [19]

Jarwala et al.

[11] Patent Number: 5,444,716
[45] Date of Patent: Aug. 22, 1995

[54] BOUNDARY-SCAN-BASED SYSTEM AND METHOD FOR TEST AND DIAGNOSIS

[75] Inventors: Najmi T. Jarwala, Lawrenceville, N.J.; Paul A. Stiling, Naperville; Enn Tammaru, both of Naperville, Ill.; Chi W. Yau, Yardley, Pa.

[73] Assignee: AT&T Corp., Murray Hill, N.J.

[21] Appl. No.: 113,460

[22] Filed: Aug. 30, 1993

[51] Int. Cl.⁶ ............................................. G01R 31/28
[52] U.S. Cl. ................................................ 371/22.3
[58] Field of Search ............... 371/22.3; 364/578, 579, 364/488, 489; 324/73.1, 158 R

[56] References Cited

U.S. PATENT DOCUMENTS

| | | | |
|---|---|---|---|
| 4,872,125 | 10/1989 | Catlin | 364/578 |
| 4,872,169 | 10/1989 | Whotsol, Jr. | 371/223 |
| 5,029,166 | 7/1991 | Jarwala et al. | 371/22.1 |
| 5,132,635 | 7/1992 | Kennedy | 377/223 |

FOREIGN PATENT DOCUMENTS

| | | | |
|---|---|---|---|
| 0417905 | 8/1990 | European Pat. Off. | |
| 2260414 | 4/1993 | United Kingdom | 371/22.3 |

OTHER PUBLICATIONS

*IEEE Standard Test Access Port and Boundary-Scan Architecture*, IEEE Std. 1149.1, IEEE Computer Society, May 1990.

C. W. Yau and N. Jarwala, "The Boundary-Scan Master: Target Applications and Functional Requirements," Proceedings, IEEE International Test Conference, 1990 pp. 311–315.

N. Jarwala and C. W. yau, "The Boundary-Scan Master: Architecture and Implementation," Proceedings, European Test Conference 1991, pp. 1–10.

J. C. Lien and M. A. Breuer, "Test Program Systhesis for Modules and Chips having Boundary Scan,"*Journal of Electronic Testing*, vol. 4, No. 2, May 1993, pp. 159–180.

N. T. Jarwala and C. W. Yau, "A Structured Approach to Board-Level BIST Using the Boundary-Scan Master," *Microprocessors and Microsystems*, vol. 17, No. 5, Jun. 1993, pp. 289–297.

N. Jarwala and C. W. Yau, "Achieving Board-Level BIST Using the Boundary-Scan Master,"*Proceedings, IEEE InternationalTest Conference*, 1991, pp. 649–658.

*Primary Examiner*—Ellis B. Ramirez
*Attorney, Agent, or Firm*—Robert B. Levy

[57] ABSTRACT

A system (10) for testing one or more circuit boards ($12_1$–$12_n$), each containing at least one chain of Boundary-Scan cells ($14_1$–$14_p$), includes a system test and diagnosis host (16) for managing overall testing of the system formed by the circuit boards. A Boundary-Scan Virtual Machine (BVM) (17) is operative to receive an initiate test command from the system test and diagnosis host independent of the number and nature of the boards to be tested. In response to the test command, the BVM (17) causes each circuit board to execute a test program (23) specific thereto to determine the errors, if any, in the board. The errors from each board are passed back to the BVM (17) which, in turn, interprets the errors to yield test information, indicative of the operation of the boards, which is then passed back to the system test and diagnosis host (16).

8 Claims, 3 Drawing Sheets

BOUNDARY-SCAN MASTER

BOUNDARY-SCAN-BASED SYSTEM AND METHOD FOR TEST AND DIAGNOSIS

TECHNICAL FIELD

This invention relates to a method and an apparatus for testing one or more circuit boards in a system wherein each board contains a plurality of Boundary-Scan-testable electronic components coupled to each other.

BACKGROUND OF THE INVENTION

Traditionally, circuit boards have been tested via a bed-of-nails test fixture to detect faults, such as a failed connection between a node (i.e., a pin) of one component (e.g., an integrated circuit) on the board and a node of another component on the same board. As the density of components on a circuit board has increased, testing via the traditional bed-of-nails fixture has become increasingly more difficult to perform because of a reduced access to the nodes of the components on the board. For this reason, many circuit boards are now being designed with a Boundary-Scan test architecture of the type set forth in the ANSI/IEEE Standard 1149.1, *Test Access Port and Boundary-Scan Architecture*, incorporated by reference herein.

In accordance with the ANSI/IEEE Boundary-Scan architecture, selected components on the board are each provided with one or more Boundary-Scan cells, each comprising a single-bit register. Each Boundary-Scan cell is coupled to a node of a component, such as an input, output, input/output or control node. The Boundary-Scan cells are serially coupled in a single chain, usually referred to as a Boundary-Scan chain. To accomplish Boundary-Scan testing of a board, a string of bits is shifted through the chain of Boundary-Scan cells so that each bit is latched in a separate cell in the chain. As the bits are shifted through the chain of Boundary-Scan cells, each cell coupled to an output node of a component is "updated," i.e., the bit shifted into the cell appears at the corresponding output node coupled to it. In turn, the bit appearing at an output node will be "captured" by a Boundary-Scan cell associated with an input node of a component driven by this output node. To check whether the connections between the Boundary-Scan-testable components are fault-free, the bits in the chain of Boundary-Scan cells are shifted out and compared to a bit string obtained under fault-free conditions.

Boundary-Scan testing in the manner described above is controlled by way of a Boundary-Scan Master (BSM) on each circuit board. The BSM is comprised of a logic block that receives test information from a test and diagnosis host (i.e., a processor). In response to a test command from a host test and diagnosis processor specific to the type of circuit board to be tested, the BSM on that board accomplishes Boundary-Scan testing of the components that are coupled in the Boundary-Scan chain. In addition, the BSM may also initiate Built-In Self-Testing (BIST) of those components on the circuit board having such a capability. Further, the BSM may also be provided with the capability of compressing responses generated by the Boundary-Scan-testable components upon the completion of testing.

In theory, each BSM affords its associated circuit board an ability to accomplish nearly complete self-testing that can be exploited during testing of a system containing multiple boards. Yet there are practical limitations that have heretofore adversely affected the ability to accomplish optimal Boundary-Scan testing on a system level. For example, different systems tend to utilize different types of test and diagnosis processors, thus giving rise to different processor architectures for which account must be taken. Different protocols may also exist which adds to the issue of variability.

Further, tests performed at the system level are primarily functional tests and, as such, are generally independent of changes or revisions to the boards themselves. By contrast, Boundary-Scan and Built-In Self-Test techniques generally accomplish structural testing that may be affected by changes in the components on the board and/or the interconnections between them. Heretofore, it has been necessary to modify the system test and diagnosis software to take account of such changes, even if they do not affect the system functionality.

Thus, there is a need for a Boundary-Scan-based test and diagnosis technique that is simple and affords early fault detection with a high degree of accuracy.

SUMMARY OF THE INVENTION

Briefly, in accordance with a preferred embodiment of the invention, there is provided a system for testing at least one circuit board containing a plurality of Boundary-Scan-testable components connected to each other. The testing system includes a system test and diagnosis host (i.e., a processor) for initiating testing and diagnosis without regard to the specific nature of the board to be tested. A Boundary-Scan Master Virtual Machine (BVM) is coupled to the host processor and receives the high-level initiate testing command therefrom. The BVM interprets the initiate testing command and thereafter communicates to each board at least one test command to cause it to commence testing in accordance with a test program specific to the board itself. The BVM also includes a separate Boundary-Scan Master (BSM) carded by each circuit board. Each BSM includes a processor and a set of registers for executing the test program to carry out Boundary-Scan testing and to provide the results of such testing to the interpreter of the BVM. The BVM interpreter interprets the test results to provide the host processor with test information regarding the status of the circuit board, including the faults, if any.

As may be appreciated, the BVM enables the system test and diagnosis host to manage testing on a generic basis without concern as to the specific details of the boards under test. The specific details concerning each circuit board are managed by the BVM.

DETAILED DESCRIPTION

Figure 1:
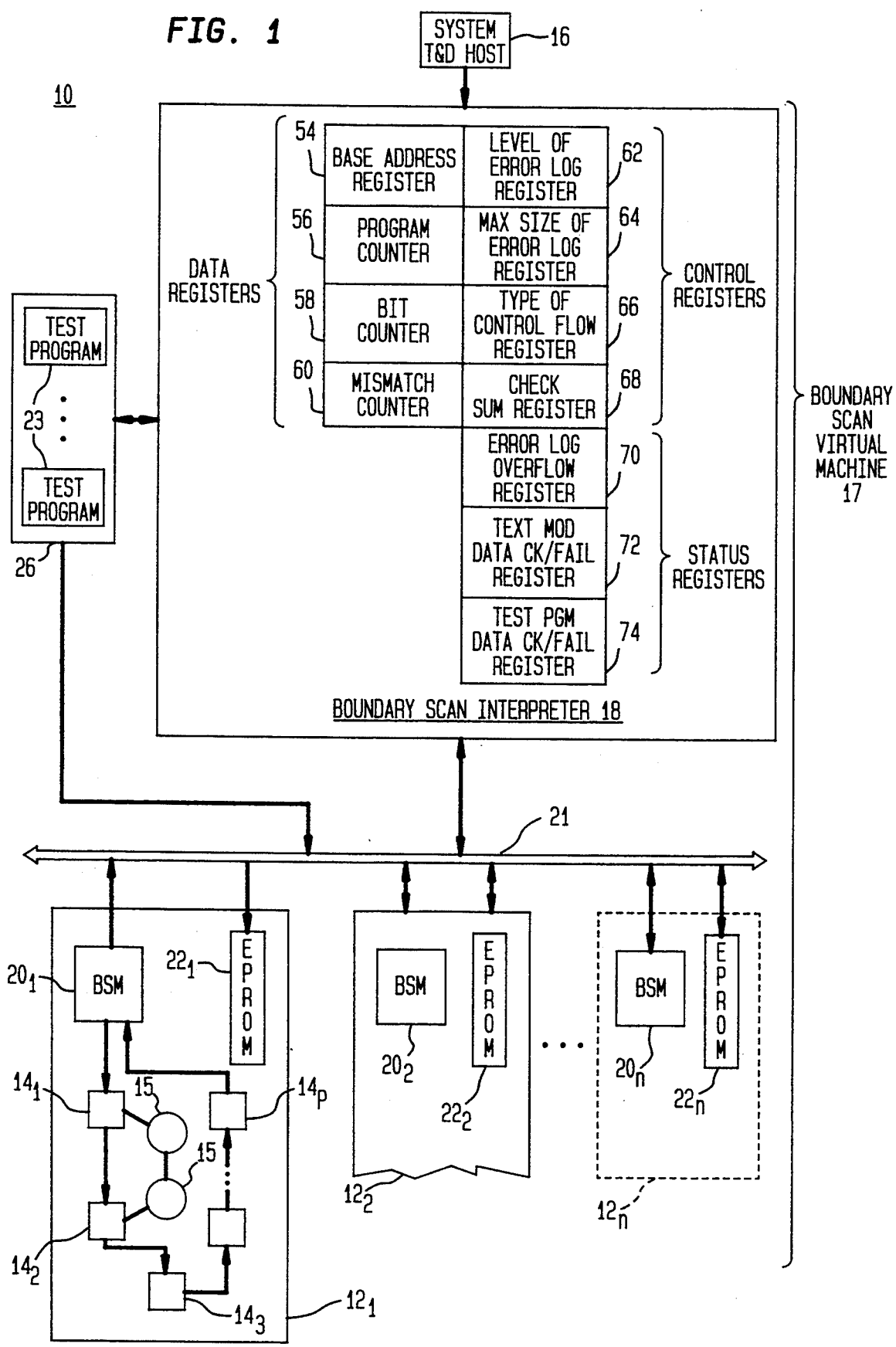
FIG. 1 is a block schematic diagram of a test system in accordance with a preferred embodiment of the invention, for testing at least one circuit board.

FIG. 1 illustrates a test system 10, in accordance with a preferred embodiment of the invention, for testing a plurality of circuit boards $12_1$, $12_2$ ... $12_n$, (where n is an integer). Collectively, the circuit boards $12_1$, $12_2$ ... $12_n$ comprise an electronic system, such as a central office telephone switch. Each circuit board $12_i$ (where i is an integer <n) has a Boundary-Scan architecture, including a plurality of Boundary-Scan cells $14_1$, $14_2$, $14_3$ ... $14_p$ (where p is an integer) coupled serially in a single Boundary-Scan chain. (Although not shown, the Boundary-Scan cells $14_1$–$14_p$ on the board $12_i$ may be coupled in series with each chain of Boundary-Scan cells on one or more other circuit boards). The Boundary-Scan cells $14_1$–$14_p$ each comprise a single-bit register associated with a node of an electronic component 15, such as an integrated circuit or the like. Each Boundary-Scan cell is responsive to the state of the signal present at the component 15 node associated with that cell to facilitate testing of the interconnections between the components in accordance with the Boundary-Scan test technique described at the outset.

The test system 10 includes a system test and diagnosis host (i.e., processor) 16 for initiating testing of the circuit boards $12_1$–$12_n$ to functionally test the system collectively formed by the boards. The test and diagnosis host 16 may take the form of a processor that is dedicated to initiating and managing testing of the circuit boards $12_1$–$12_n$. Alternatively, the test and diagnosis host 16 may take the form of a processor that performs a variety of functions, only one of which involves initiation and management of the testing of the circuit boards $12_1$–$12_n$. Regardless of whether the system test and diagnosis host 16 manages testing of the circuit boards on an exclusive basis or on a shared basis with other tasks, the test and diagnosis host, in accordance with the invention, only manages the testing and diagnosis of the circuit boards $12_1$–$12_n$ on a system level. In other words, the test and diagnosis host 16 does not control the actual testing of each individual circuit board and, thus, is not concerned with the specific details of each board.

Actual testing of the circuit boards $12_1$–$12_n$ is carried out by a Boundary-Scan Master Virtual Machine (BVM) 17 that includes an interpreter 18 and a plurality of Boundary-Scan Masters (BSMs) $20_1$, $20_2$ ... $20_n$, all coupled to the BVM interpreter via a bus 21. Each of the BSMs $20_1$, $20_2$ ... $20_n$ is carried by a separate one of the circuit boards $12_1$–$12_n$. As will be discussed in greater detail below, each BSM controls the testing of that circuit board.

Figure 3:
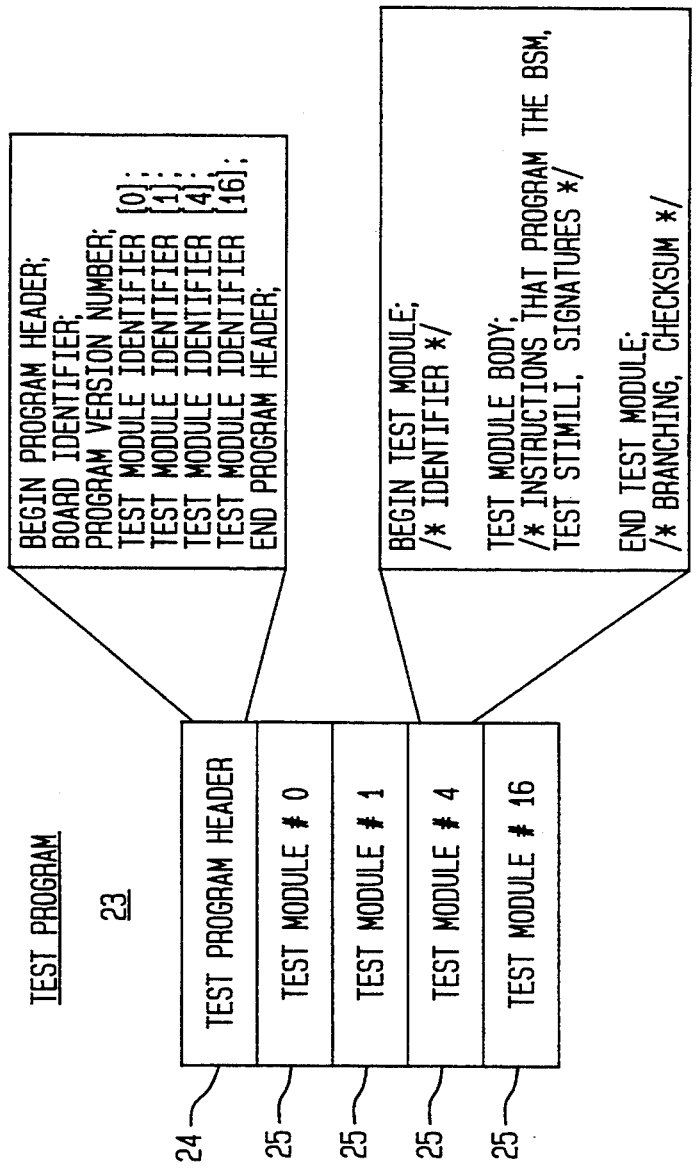
FIG. 3 is a table listing a portion of a test program for testing one of the circuit boards of FIG. 1.

Associated with each of the BSMs $20_1$–$20_n$ is a separate one of a plurality of Electrically Programmable Read-Only Memories (EPROMs) $22_1$, $22_2$ ... $22_n$. Each EPROM $22_i$ stores a separate test program 23 unique to its corresponding BSM. As best seen in FIG. 3, which will be described in greater detail below, each test program 23 is comprised of a header portion 24 and at least one, and up to two hundred fifty-five separate modules 25 (only the modules #0, #1, #4 and #16 being shown by way of illustration). Referring to FIG. 1, instead of storing the test program 23 for each of the BSMs $20_1$–$20_n$ within the corresponding one of the EPROMS $22_1$–$22_n$, the test programs for each of the BSMs could be collectively stored by a magnetic disk 26. In the event that the test programs 23 are stored by the disk 26, then the need for the EPROMS $22_1$–$22_n$ would be obviated.

Figure 2:
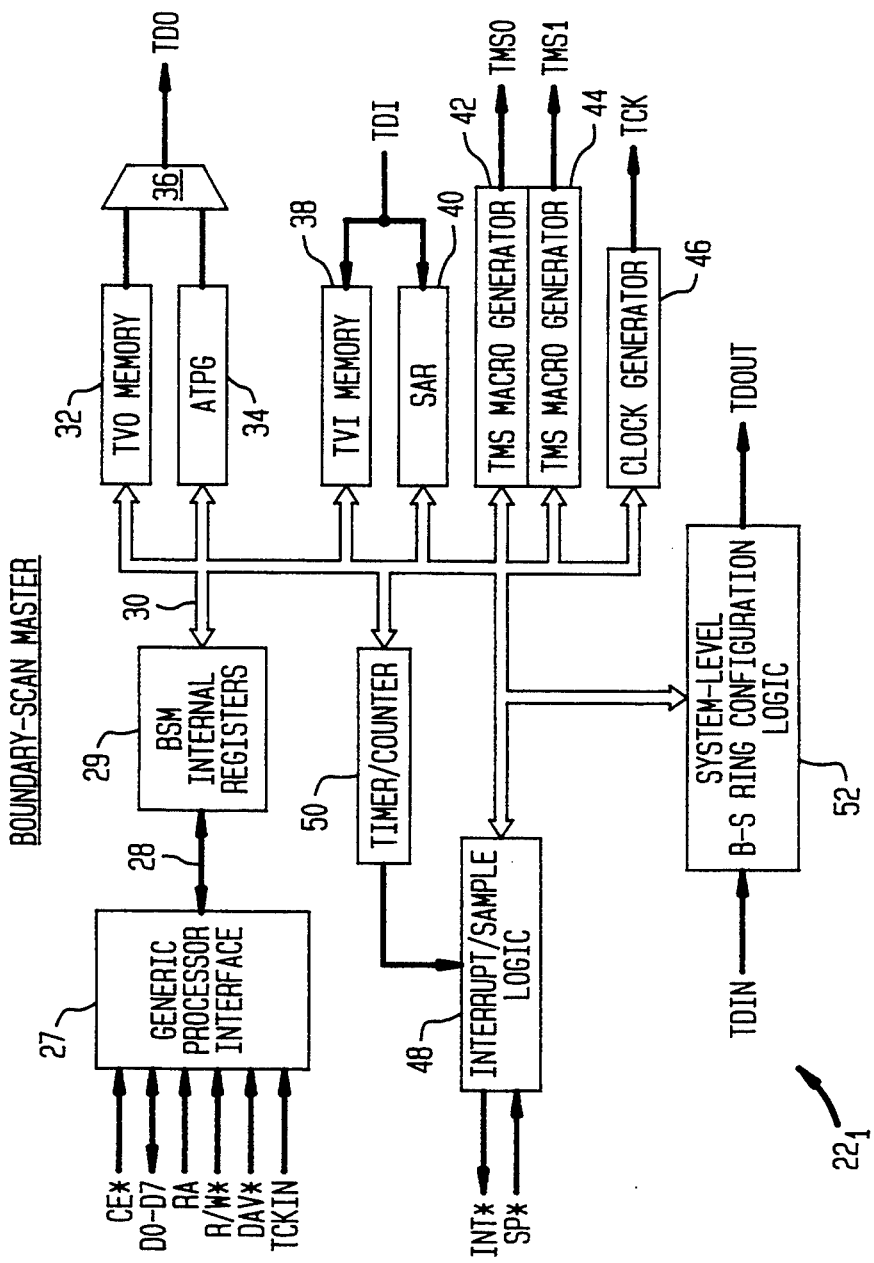
FIG. 2 is a schematic diagram of a Boundary-Scan master comprising part of the test system of FIG. 1.

The BSMs $20_1$–$20_n$ are identical to each other and therefore only the BSM $20_1$ will be described in detail. Referring to FIG. 2, the BSM $20_1$ includes a Generic Processor Interface (GPI) 27, in the form of a microprocessor or the like, that is operative to control the testing of the board $12_1$ in accordance with the test program 23 of FIG. 1 specific to the board. The GPI 27 has an eight bit data bus (D0–D7), a single bit address line (RA) and control bus that includes a read/write control signal line (R/W*), a data valid signal line (DAV*), and a chip-enable signal line (CE*). The clocking of the GPI 27 is controlled by a clock signal TCKIN.

The GPI 27 is coupled, via a bidirectional bus 28, to an internal register bank 29 that contains a plurality of registers, typically eighteen in number. Table I provides an indication of the identity and function of the registers contained in the register bank 29.

TABLE I

| Register Name | Register Description |
|---|---|
| Control/Pointer Register | This register is directly accessible by the GPI 27 and has a five-bit field used to address the other registers in the bank 29. This register also stores a control bit that determines whether the BSM is to be set to a program mode to enable the BSM to be programmed for a specific test, or to an execution mode during which the BSM executes that test. |
| General Control Register | This register is used to set a Boundary-Scan clock signal TCK for clocking the devices 15 of FIG. 1 as a fraction of the TCKIN clock frequency. This register also serves to store a value indicative of a Test Mode Select (TMS) signal macro type and to enable generation of TMS signals. |
| Configuration Register | This register contains the data bus width for the BSM. Also, this register contains a mode bit indicative of whether the BSM is to operate independently (i.e., a uni-ring mode) or to operate collectively with the other BSM on one or more other boards (i.e., a multi-ring mode). This register also stores a pair of bits that specify which of four separate test patterns is to be generated. |
| Test Vector Manipulation Register | This register provides the primary test resource control for determining the source of test vectors supplied to the circuit board. This register also determines the destination for responses generated during testing. |
| Interrupt Register | This register contains the status and masks associated with each of three sources of interrupts generated by the BSM. |
| Testability Register | This register configures and controls the self-test execution of the BSM and provides access to the self-test signature of the BSM. |
| APO/API Registers | These registers each contain a pointer for pointing to a word address in each of a pair of memories (described hereinafter) that store input and output test vectors, respectively. |
| TMR0 and TMR1 Registers | These registers each store a separate one of a pair of macro instructions for enabling each of a separate pair of TMS signal generators (described hereinafter) to generate a separate one of a pair of TMS signals, TMS0 and TMS1, respectively. |
| Loop Counter | This register (actually a counter) serves to store a value corresponding to the number of tests to be applied to the circuit board $12_1$ of FIG. 1. Each time a complete serial test vector is applied to the components 15 of FIG. 1, this register is decremented. |
| Scan Duration Register | This register contains a value corresponding to the length of each test vector applied to the circuit board $12_1$ of FIG. 1. |
| Net Count Register | This register contains a value used for generating a walking sequence of test vectors. |
| TVO and TVI Access Registers | These registers serve as windows to access the contents of each of a pair of memories, respectively, (described hereinafter) that store output and input test vectors, respectively. |
| Programmable Timer Counter | This register (actually a counter) is driven by a clock that is 256 times slower than the |

TABLE I-continued

| Register Name | Register Description |
| --- | --- |
| | TCKIN clock signal. When the register is decremented to zero, it generates an interrupt that can be used for timing purposes. |
| Signature Analysis Access Register | This register serves as a window to access a register (described hereinafter) that stores a test signature for the circuit board $12_1$. |
| Pseudo-random Pattern Generator Access Register | This register serves as a window for storing a seed for a pseudo-random test pattern generator (not shown) that generates pseudo-random test patterns. |

The register bank 29 is coupled via a bidirectional bus 30 to a first memory bank (32) and to an automatic test pattern generator 34. The first memory bank 32 is designated as a Test Vector Output (TVO) memory because it stores a set of deterministic test vectors for testing the circuit board $12_1$ of FIG. 1. The vectors in the TVO memory 32 are generated in advance of testing. The Automatic Test Pattern Generator (ATPG) 34 typically takes the form of a Linear Feedback Shift Register that generates a separate one of four different patterns of test vectors in accordance with information stored in the Test Vector Manipulation register within the BSM internal register bank 29. The TVO memory 32 and the APTG 34 are coupled to a first and a second input, respectively, of a multiplexer 36 that passes the signal at a selected one of its first and second inputs to its output, designated as the Test Data Output (TDO) of the BSM $20_1$. The TDO output of the BSM $20_1$ is coupled to a test data input of the chain of Boundary-Scan cells $14_1$–$14_p$ of FIG. 1.

The register bank 29 is also coupled by the bus 30 to a second memory bank 38, designated as the Test Vector Input (TVI) memory bank. The TVI memory bank 38 stores responses generated by the chain of Boundary-Scan cells $14_1$–$14_p$ of FIG. 1, in response to test vectors supplied thereto, via the multiplexer 36. The responses generated by the circuit board $12_1$ of FIG. 1 are also compacted by a Linear Feedback Shift Register 40. The register 40 is designated as the Signature Analysis Register (SAR) because it stores a signature (i.e., a compacted set of responses) indicative of the operation of the circuit board $12_1$ of FIG. 1.

The BSM $20_1$ of FIG. 2 includes a pair of Test Mode Select (TMS) signal generators 42 and 44, each coupled to the bus 30. The TMS generators 42 and 44 each generate a separate one of a pair of TMS signals, TMS0 and TMS 1, respectively, which is capable of controlling a separate one of a pair of chains of Boundary-Scan cells in accordance with the Boundary-Scan test technique described in the ANSI/IEEE Standard 1149.1 *Test Access Port and Boundary-Scan Architecture,* incorporated by reference herein. In the event that only a single chain of Boundary-Scan cells is to be controlled, then one of the TMS generators 42 and 44 could be deleted.

Also associated with the BSM $20_1$ is a clock generator 46, coupled to the bus 30, for generating a clock signal TCK supplied to the components (not shown) on the circuit board $12_1$ of FIG. 1 during intervals of Boundary-Scan testing. The clock generator 46 generates the TCK signal by a programmable value, ranging from one to one hundred twenty-eight. The reason why the clock generator 46 effectively slows down the TCK signal is that often, there may be one or more slow components 15, each associated with a separate one of the Boundary-Scan cells $14_1$–$14_p$ within the Boundary-Scan chain. As a consequence, the clock speed must be slowed to the required clock speed of the slowest component 15.

The BSM $20_1$ also includes an interrupt/sample logic circuit 48 coupled to the bus 30. The interrupt/sample logic typically comprises a register and associated random logic that is clocked by a timer/counter 50. The function of the interrupt/sample logic 48 is to facilitate sampling of information generated by the chain of Boundary-Scan cells during testing. To sample the information, the circuit 48 is triggered by a sample signal SP*. In response to the sample signal SP*, the interrupt/sample logic 48 generates an interrupt INT* to signify that it is ready to provide the sampled data which is read via bus 30.

The BSM $20_1$ further includes a System-Level Boundary-Scan (B-S) Ring Configuration Logic circuit 52 of the type described in U.S. Pat. No. 5,029,166 (herein incorporated by reference) for allowing the BSM to operate in both a uni-ring or multi-ring mode. When operating in the uni-ring mode, the BSM $20_1$ functions independently of the other BSMs and serves to test only the chain of Boundary-Scan cells $14_1$–$14_p$ on the circuit board $12_1$. When operating in the multi-ring mode, the BSM $20_1$ cooperates with one or more other BSMs to test the individual chains of Boundary-Scan cells $14_1$–$14_p$.

As discussed, control of the individual BSMs $20_1$–$20_n$ is accomplished by the BVM interpreter 18 of FIG. 1. Referring to FIG. 1, the interpreter 18 comprises a set of data registers 54–60, a set of control registers 62–68, and a set of status registers 74. The data register 54 is designated as a Base Address Register as it stores a beginning (base) address of the test program 23 in each of the EPROMs $22_1$–$22_n$. From this address, the location any of the modules 25 of the test program stored in a corresponding EPROM can be established. The register 56 is designated as the Program Counter, as it maintains the location currently being accessed within a particular one of the EPROMS $22_1$–$22_n$. The register 58 is designated as the Bit Counter because this register accumulates the number of bits read back from a particular one of the BSMs $20_1$–$20_n$ in response to a specific read instruction (RDB) which is executed to read the registers in the internal register bank 29 of FIG. 2. The Bit Counter 58 tracks the identification of a bit that has been found mismatched within the test program 23 in order to provide the highest level of diagnostic resolution supported by the BVM 17. Every time a bit is found to be mismatched, its location within the test program stored in the EPROM, as identified by the counter 58, is logged.

The data register 60 is designated as the Mismatch Counter as it counts the number of mismatches. When the number of mismatches reaches a prescribed value, as counted by the Mismatch counter 60, error logging (i.e. counting of mismatches) is terminated.

The control register 62 is designated as the Level of Error Log register, as it stores a value (typically 2 bits-wide) indicative of the level of error logging requested by the system test and diagnosis host 16. The control register 64 is designated as the Maximum Size Of Error Log register as it stores a value that sets a size limit on the error log. Control register 66 is designated as the Flow Control Type Register as it contains a value specifying the type of flow control to be followed in executing the test program 20. Depending on the value stored in the register 66, successive modules 25 of the test program 23 are executed under the control of the system test and diagnosis host 16, or a default flow control embedded in the test program is followed. Control register 68 is designated as a Checksum/Cyclic Redundancy Check (CRC) register, The register 68 stores a value contained in the test program 23 which dictates whether a checksum or a CRC is executed.

The status register 70 is designated as the Error Log Overflow Hag as it functions to indicate when the error log has overflowed and error logging should terminate. The status register 72 is designated as the Test Module Data/Chk Fail Flags, as the register contains two values, each serving as a flag to indicate whether the current module 25 (see FIG. 3) of the test program 23 of FIGS. 1 and 3 has failed (that is, any bit has been found mismatched) or whether its checksum/CRC value failed to match. These two flags can be used to evaluate the pass/fail status of the current test module 25. The last status register 74 is designated as the test Program Data/Chk Fail Flags, as the register contains two values that record whether the current test program 23 has failed while executing or whether its checksum/CRC has failed. The two values in the register 76 can be used to evaluate the pass/fail nature of the entire program.

Referring to FIG. 3, there is the detail of the test program 23, which, as discussed, includes the header 24 and a plurality of separate modules 25. The header 24 contains the preamble of the test program. In addition to a begin program header operation code, which signifies the beginning of the test program, the header 24 also contains the following information: (1) the circuit board identity, (2) the particular version of the board, (3) the contents of the test program (the number and locations of the test modules), and (4) whether a checksum or CRC is being used to verify the test program's integrity. At the end of the test program is an end program header code to signify that the program header contains no further instructions.

The test program 23 also contains a plurality of test modules 25, each containing a test that is to be applied to the circuit board. The test modules 25 may include a BSM self-test, a Boundary-Scan integrity test, an interconnect test, Built-In Self-Test execution (if any of the components 15 are so equipped), as well as a cluster test. As seen in FIG. 3, each test module 25 starts with a begin test module operation code, indicating that the test module is to begin. Following the begin test module command is the body of the test module which contains instructions that program the BSM to execute a particular test, as well as test stimuli, and expected test signatures. The end of the test module is indicated by way of an End Test Module operation code which contains branching information as well as a checksum or CRC.

The BVM 17 of FIG. 1 operates to accomplish testing of the circuit boards $12_1$-$12_n$ in the following manner. First, an initiate test command is sent from the system test and diagnosis host 16 to the BVM 17 to initiate testing. In addition to the initiate testing command, the system diagnostic host 16 also passes various parameters to the BVM 17, including the location of the test program, the desired degree of diagnostic resolution, type of flow control etc. As should be appreciated, the information passed by the system test and diagnosis host 16 is devoid of the particular details concerning each of the individual circuit boards $20_1$-$20_n$.

As alluded to previously, there are two modes of operation for the BVM 17: (1) default flow control, and (2) operation under the control of the system test and diagnosis host 16. Operation under default flow control occurs in the absence of a command by the test and diagnosis host to execute specific test modules. Thus, under default flow control operation, the BVM 17 causes each corresponding one of the BSMs $20_1$-$20_n$ to execute its entire test program 23 of FIGS. 1 and 3, including all of the test modules 25 of FIG. 3.

While the system test and diagnosis host 16 of FIG. 1 does not directly determine which of the test modules 25 of FIG. 3 are executed under default flow control, the host nevertheless requires access to the test program header 24 of FIG. 3 prior to test program execution in order to determine an upper bound for test program duration. The reason for obtaining this information is to enable the test and diagnosis host 16 to protect against the possibility that the BVM 17 may wait indefinitely for a specific event that may never occur. Typically, the test and diagnosis host 16 would invoke the BVM 17 through the interpreter 18 of FIG. 1 to gain access to the test program header 24 of FIG. 3. The interpreter 18 would pass the program header 24 and then terminate. Thereafter, the test and diagnosis host would invoke the BVM 17 through the interpreter 18 to enable the interpreter to operate under default flow control. The starting point for the interpreter 18 will also be the header 24 of the test program since the information contained in the header is needed for default flow control.

When the interpreter 18 is invoked, the first operation code encountered in the test program must be the Begin Program Header code in the program header 24 of FIG. 3, signifying the start of the test program header. If this operation code is not encountered, then execution of the test program must be terminated. When the Begin Program Header operation code is encountered as the first instruction of the test program header 24, as will normally be the case, then the interpreter 18 stores certain information contained therein in order to set the appropriate parameters for the various registers 54-74. At the end of the program header 24 of FIG. 3, the checksum/CRC for the program header is computed. If the check fails, execution of the test program header 24 is terminated.

Assuming that the checksum/CRC for the test program header 24 passes, then the first test module 25 following the test program header is executed, one instruction at a time by the corresponding BSM. The nature of the instructions will depend on the type of test being executed. For example, one or more read operations may be executed after which a comparison occurs between each byte read and its expected value after applying a mask. Failure of a match between the byte just read and the masked expected byte causes the test module data fail flag contained in register 72 of FIG. 1 to be set. Also, upon the execution of each read operation, the bit counter (register 58) is incremented. Further failure information, as requested by the test and diagnosis host is logged.

As each instruction of the module 25 is executed, the checksum/CRC is computed. At the end of execution of the test module 25, the checksum/CRC is tested. If the checksum/CRC fails, the test module check fail flag contained in register 72 is set. Should either of the flags contained in register be set, then the test program fail flag contained in register 74 will be set.

Operation under the test and diagnosis host 16 is generally simpler than operation under default flow control. When operating under the test and diagnosis host 16, the interpreter 18 of the BVM 17, through the corresponding BSM, looks for the Begin Program Header in the test program header 24 and thereafter computes the checksum/CRC before exiting the test program header upon an End Program Header operation code. If the first operation code is a Begin Test Module operation code, then the first test module 25 is executed by the BSM, whereupon the test program module is then exited upon the End Test Module operation code. Error logging and computation of the checksum/CRC are also performed. Under operation of the system test and diagnosis host 16, the interpreter 18 executes only a single test module 25 (or the program header 24) at one time and thereafter awaits instructions from the system test and diagnosis host as to which test module is to executed next.

The foregoing describes a test system (10) for testing at least one, and a preferably a plurality of circuit boards $12_1$–$12_n$, each containing at least one chain of Boundary-Scan cells $14_1$–$14_p$.

It is to be understood that the above-described embodiments are merely illustrative of the principles of the invention. Various modifications and changes may be made thereto by those skilled in the art which will embody the principles of the invention and fall within the spirit and scope thereof. For example, while the interpreter 18 of FIG. 1 has been described in terms of a plurality of physical registers 54–74, it should be understood that the function of the interpreter could easily be performed by way of a software program, either running on a stand-alone machine, or running as part of the software executed by the system test and diagnosis host 16.

We claim:

1. A system for testing at least one circuit board containing a plurality of Boundary-Scan-testable electronic components coupled in a serial Boundary-Scan chain, comprising:
   a test and diagnostic host processor for generating an initiate test command to initiate Boundary-Scan testing of each board and for receiving test information indicative of its operation;
   a Boundary-Scan Master Virtual Machine (BVM) responsive to the initiate test command from the test and diagnostic host processor for communicating to each circuit board a test command to cause said circuit board to execute a test program specific thereto, thereby causing the board to undergo testing and to generate test results, the BVM interpreting the test results and communicating such results to the test and diagnosis host as test information indicative of the operation of the circuit board; and
   a communications bus coupling each circuit board to the BVM.

2. The system according to claim 1 wherein the BVM comprises:
   a Boundary-Scan Master (BSM), associated with and carried by each circuit board, the BSM executing the test program specific to the circuit board associated therewith to test the circuit board and to receive from the circuit board test information indicative of its operation;
   a program storage memory associated with each separate BSM for storing a test program specific to the circuit board which carries the BSM; and
   a Boundary-Scan interpreter for interpreting the initiate test command from the test and diagnosis host so as to cause each BSM to execute its corresponding test program to test its associated circuit board and for interpreting test information received from each BSM in order to provide the test and diagnosis host with test information indicative of the operation of the circuit boards.

3. The system according to claim 2 wherein the Boundary-Scan interpreter comprises:
   a plurality of data registers for storing information passed by the system test and diagnosis host to the BVM, including information indicative of the location of the test program and information related to errors in each circuit board detected during testing;
   a plurality of control registers for storing information to control the testing of each circuit board, including information related to the execution of the test program; and
   a plurality of status registers which record the status of errors occurring during testing.

4. The system according to claim 1 wherein each test program comprises:
   a test program header containing information indicative of the circuit board for which the program is to be executed and information indicative of which tests are to be performed upon the board; and
   at least one test module containing a test to be executed upon the circuit board.

5. A system for testing a plurality of circuit boards, each containing a plurality of Boundary-Scan-testable electronic components coupled in at least one serial Boundary-Scan chain, comprising:
   a test and diagnostic host processor for generating an initiate test command to initiate Boundary-Scan testing of the boards and for receiving test information indicative of the operation of the boards;
   a plurality of Boundary-Scan masters, each associated with and carried by a separate one of the circuit boards, each BSM executing a test program specific to the circuit board associated therewith to test the circuit board and to receive from the circuit board test information indicative of its operation;
   a plurality of program storage memories, each associated with a separate BSM for storing the test program specific to the circuit board which carries that BSM; and
   a Boundary-Scan interpreter for interpreting the initiate test command from the test and diagnosis host so as to cause each BSM to execute its corresponding test program to test its associated circuit board and for interpreting test information received from each BSM in order to provide the test and diagnosis host with test information indicative of the operation of the circuit boards.

6. The system according to claim 5 wherein the Boundary-Scan interpreter comprises:
   a plurality of data registers for storing information passed by the system test and diagnosis host to the BVM, including information indicative of the location of the test program and information related to errors in each circuit board detected during testing;
   a plurality of control registers for storing information to control the testing of each circuit board, including information related to the execution of the test program; and a plurality of status registers which record the status of errors occurring during testing.

7. The system according to claim 5 wherein each test program comprises:

a test program header containing information indicative of the circuit board for which the program is to be executed and information indicative of which tests are to be performed upon the board; and at least one test module containing a test to be executed upon the circuit board.

8. A method for testing at least one circuit board containing a plurality of Boundary-Scan-testable electronic components coupled in a serial Boundary-Scan chain, comprising the steps of:

generating a high-level test command at a system test and diagnosis host to initiate testing of the circuit board;

interpreting the test command from the system test and diagnosis host to provide a test instruction to each circuit board to cause each circuit board to execute a test program specific thereto and to generate test results indicative of errors in the board; and interpreting the test results from the circuit board to establish test information indicative of the operation of the board which is transmitted to the system test and diagnosis host.

* * * * *